(12) United States Patent
Hongo et al.

(10) Patent No.: US 10,499,550 B2
(45) Date of Patent: Dec. 3, 2019

(54) BRAID AND WIRE HARNESS

(71) Applicant: Yazaki Corporation, Tokyo (JP)

(72) Inventors: Satoko Hongo, Susoni (JP); Hiroki Kondo, Susoni (JP); Yutaka Handa, Susoni (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 16/035,090

(22) Filed: Jul. 13, 2018

(65) Prior Publication Data
US 2019/0045677 A1 Feb. 7, 2019

(30) Foreign Application Priority Data

Aug. 3, 2017 (JP) .................. 2017-150412

(51) Int. Cl.
| | |
|---|---|
| *H05K 9/00* | (2006.01) |
| *H01B 7/00* | (2006.01) |
| *H01B 7/02* | (2006.01) |
| *D04C 1/06* | (2006.01) |
| *D04C 1/02* | (2006.01) |
| *D06M 11/83* | (2006.01) |
| *H01B 7/18* | (2006.01) |
| *D06M 101/36* | (2006.01) |
| *D06M 101/26* | (2006.01) |
| *D06M 101/30* | (2006.01) |
| *H01B 7/22* | (2006.01) |

(52) U.S. Cl.
CPC ............ *H05K 9/0098* (2013.01); *D04C 1/02* (2013.01); *D04C 1/06* (2013.01); *D06M 11/83* (2013.01); *H01B 7/0045* (2013.01); *H01B 7/02* (2013.01); *H01B 7/183* (2013.01); *D06M 2101/26* (2013.01); *D06M 2101/30* (2013.01); *D06M 2101/36* (2013.01); *D10B 2321/08* (2013.01); *D10B 2331/021* (2013.01); *D10B 2331/14* (2013.01); *H01B 7/1865* (2013.01); *H01B 7/228* (2013.01)

(58) Field of Classification Search
None
See application file for complete search history.

(56) References Cited

U.S. PATENT DOCUMENTS

| | | | | |
|---|---|---|---|---|
| 2,438,146 | A | * 3/1948 | Candee | .................. F16L 11/16 |
| | | | | 174/68.3 |
| 5,218,171 | A | * 6/1993 | Aldissi | ..................... H01B 1/22 |
| | | | | 174/113 C |
| 2013/0333914 | A1* | 12/2013 | Kumada | ............. H05K 9/0098 |
| | | | | 174/36 |

(Continued)

FOREIGN PATENT DOCUMENTS

JP 2015-18756 A 1/2015

*Primary Examiner* — William H. Mayo, III
*Assistant Examiner* — Krystal Robinson
(74) *Attorney, Agent, or Firm* — Sughrue Mion, PLLC (57) ABSTRACT

A braid includes a plurality of metal-plated bundles braided to each other, each of the metal-plated bundle having a flattened shape. Each of the metal-plated bundle includes a plurality of tensile strength fibers, a plurality of first metal plating portions that are formed on the tensile strength fibers respectively, and a second metal plating portion including the first metal plating portions therein, the first metal plating portions having the tensile strength fibers respectively.

2 Claims, 5 Drawing Sheets (56) References Cited

U.S. PATENT DOCUMENTS

| | | | |
|---|---|---|---|
| 2013/0333938 A1* | 12/2013 | Kondo | H01B 7/04 |
| | | | 174/393 |
| 2016/0028167 A1* | 1/2016 | Hanazaki | H01R 4/184 |
| | | | 439/877 |
| 2016/0155533 A1 | 6/2016 | Omoto | |
| 2016/0289857 A1* | 10/2016 | Kondo | H01B 1/04 |
| 2017/0361789 A1* | 12/2017 | Ohgushi | B60R 16/0215 |

* cited by examiner

BRAID AND WIRE HARNESS

CROSS REFERENCE TO RELATED APPLICATIONS

This application is based on Japanese Patent Application (No. 2017-150412) filed on Aug. 3, 2017, the contents of which are incorporated herein by reference.

BACKGROUND OF THE INVENTION

1. Field of the Invention

The present invention relates to a braid and a wire harness.

2. Description of the Related Art

There has been known a braid which is provided in a periphery of an electric wire so as to shield the electric wire (for example, see JP-A-2015-18756). Such a braid is formed by braiding metal wires. As the metal wires, copper wires or tin-metal-plated copper wires can be used.

Figure 7:
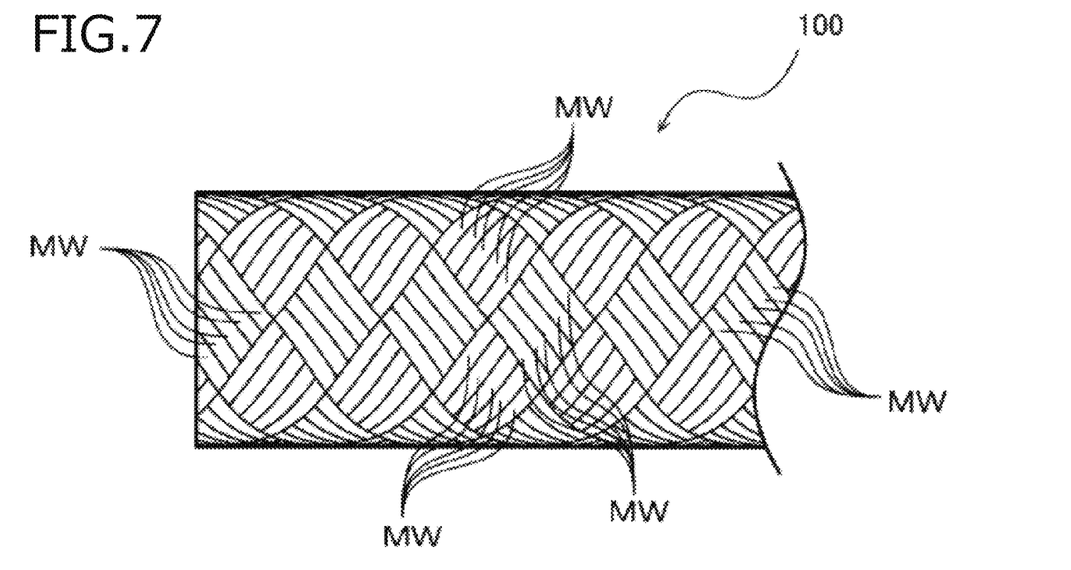
FIG. 7 is a side view showing the braid according to the comparative example.

However, there is a possibility that the metal wires in the braid described in JP-A-2015-18756 are disconnected due to repeated bending of the electric wire thereby deteriorating a shielding performance thereof. FIG. 7 is a side view showing a braid according to a comparative example. As shown in FIG. 7, a braid 100 is configured such that metal wires MW are braided so as to be folded and overlapped with each other. In the example shown in FIG. 7, five metal wires MW are arranged adjacently, and sets of these five metal wires MW are braided so as to be folded and overlapped with each other. Incidentally, the braid 100 may also be configured such that each set of metal wires MW may has 1 to 4 metal wires MW or 6 or more metal wires MW.

Figure 8A:
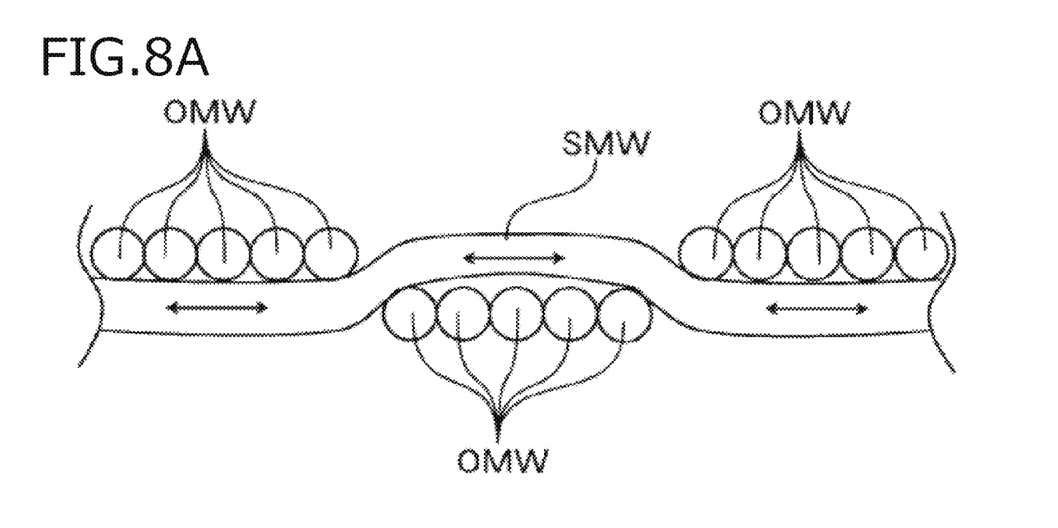
Figure 8B:
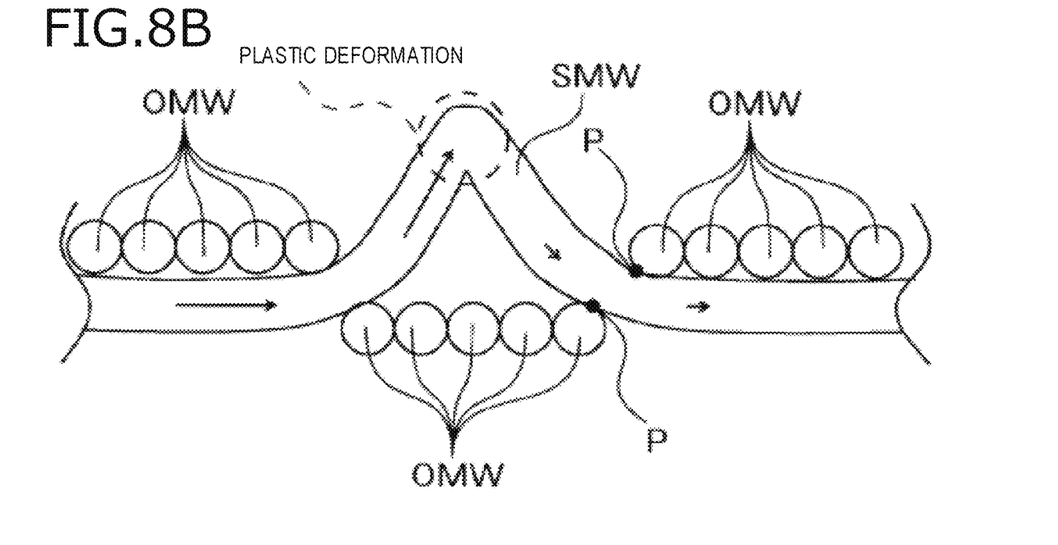

FIGS. 8A and 8B are enlarged cross-sectional views of a main part of the braid 100 shown in FIG. 7. As shown in FIG. 8A, when the braid 100 is bent, a specific metal wire SMW moves so as to slide with respect to the other metal wires OMW that are folded and overlapped. The other metal wires OMW also move and slide with respect to other metal wires.

However, when the specific metal wire SMW cannot slide for, for example, being caught at a certain position P of the other metal wires OMW when sliding, the specific metal wire SMW may be greatly bent (bent and folded) as shown in FIG. 8B. The bending (folding) is caused by plastic deformation of the specific metal wire SMW, so that when the braid 100 is bent repeatedly, the folding is also applied repeatedly to the specific metal wire SMW, and the specific metal wire SMW may be disconnected.

Further, if the disconnection concentrates at a specific part of the braid 100, a hole may be generated in the braid 100 and the shielding performance can be possibly deteriorated.

SUMMARY OF THE INVENTION

The present invention has been made to solve such problems, and an object thereof is to provide a braid and a wire harness capable of improving bending resistance.

The present invention provides a braid configured by braiding a metal-plated bundle which is flattened by applying second metal plating collectively to a plurality of metal-plated fibers in which first metal plating is applied to each tensile strength fiber.

For example, there is provided a braid including a plurality of metal-plated bundles braided to each other, each of the metal-plated bundle having a flattened shape. Each of the metal-plated bundle includes a plurality of tensile strength fibers, a plurality of first metal plating portions that are formed on the tensile strength fibers respectively, and a second metal plating portion including the first metal plating portions therein, the first metal plating portions having the tensile strength fibers respectively.

For example, each of the first metal plating portions is formed on each of the tensile strength fibers by applying first metal plating to the tensile strength fibers.

For example, the second metal plating portion is formed on the plurality of first metal plating portions collectively by applying second metal plating to the first metal plating portions collectively.

According to the braid, the metal-plated bundles flattened by applying the second metal plating collectively to a plurality of metal-plated fibers are braided, so that when the braid is bent and the metal-plated bundle slides with respect to the other metal-plated bundles, even if the metal-plated bundle is caught somewhat by the other metal-plated bundles, since the metal-plated bundle is configured by grouping a plurality of metal-plated fibers by the second metal plating, folding is less likely to occur in the metal-plated bundle with higher rigidity compared with one metal wire. In addition, since the metal-plated fiber is obtained by applying the first metal plating to the tensile strength fiber, even if the first metal plating and the second metal plating are plastically deformed due to occurrence of the folding, the internal tensile strength fiber will not be plastically deformed due to properties thereof. Due to the above circumstances, the disconnection becomes less likely to occur in the metal-plated bundle, so that a braid capable of improving bending resistance can be provided.

Here, for example, the second metal plating portion has a surface roughness of 0.1 μm or more and 0.5 μm or less.

According to the braid, since the second metal plating has a surface roughness of 0.1 μm or more and 0.5 μm or less, the metal-plated bundle easily slides, and when the braid is bent and the metal-plated bundle slides with respect to the other metal-plated bundles, it is possible to prevent the metal-plated bundles from rubbing against each other so as to prevent the disconnection.

Here, for example, a value obtained by dividing a thickness of the second metal plating portion by a thickness of each of the first metal plating portions is 0.1 or more and 1.0 or less.

According to the braid, since a value obtained by dividing the thickness of the second metal plating portion by the thickness of the first metal plating is 0.1 or more and 1.0 or less, a situation in which the metal-plated fibers applied with the first metal plating portions are easily scattered and the metal-plated bundle 12a is difficult to be flattened can be prevented, and meanwhile a possibility of breaking the first metal plating portions and the second metal plating portion by the bending can be lowered.

Further, a wire harness of the present invention includes an electric wire, the above braid which covers the periphery of the electric wire, and an exterior member which covers a periphery of the braid with a predetermined gap therebetween.

According to the wire harness, since the exterior member which covers the periphery of the braid with a predetermined gap therebetween is provided, there is a concern that when the wire harness is bent, the braid is brought into contact with an inner wall of the exterior member and is worn out, due to which the one-wire layer may be easily disconnected, but since the metal-plated bundles are flattened, the metal-plated bundles can be brought into surface contact with the inner wall of the exterior member, and a possibility of disconnection caused by the wear is lowered compared with a case where one metal wire is brought into contact with the inner wall of the exterior member.

According to the present invention, there is provided a braid and a wire harness capable of improving bending resistance.

BRIEF DESCRIPTION OF THE DRAWINGS

FIGS. 8A and 8B are enlarged cross-sectional views of a main part of the braid shown in FIG. 7, wherein FIG. 8A shows how a metal wire slides, and FIG. 8B shows how the metal wire is plastically deformed.

DETAILED DESCRIPTION OF THE EXEMPLARY EMBODIMENTS

Hereinafter, the present invention will be described in accordance with exemplary embodiments. The present invention is not limited to the embodiments described below and can be appropriately changed without departing from the spirit of the present invention. Further, in the embodiments described below, there are places where illustration and explanation of a part of the configuration are omitted, and for the details of the omitted technique, it goes without saying that known or well-known techniques are appropriately applied within a range not inconsistent with the contents described below.

Figure 1:
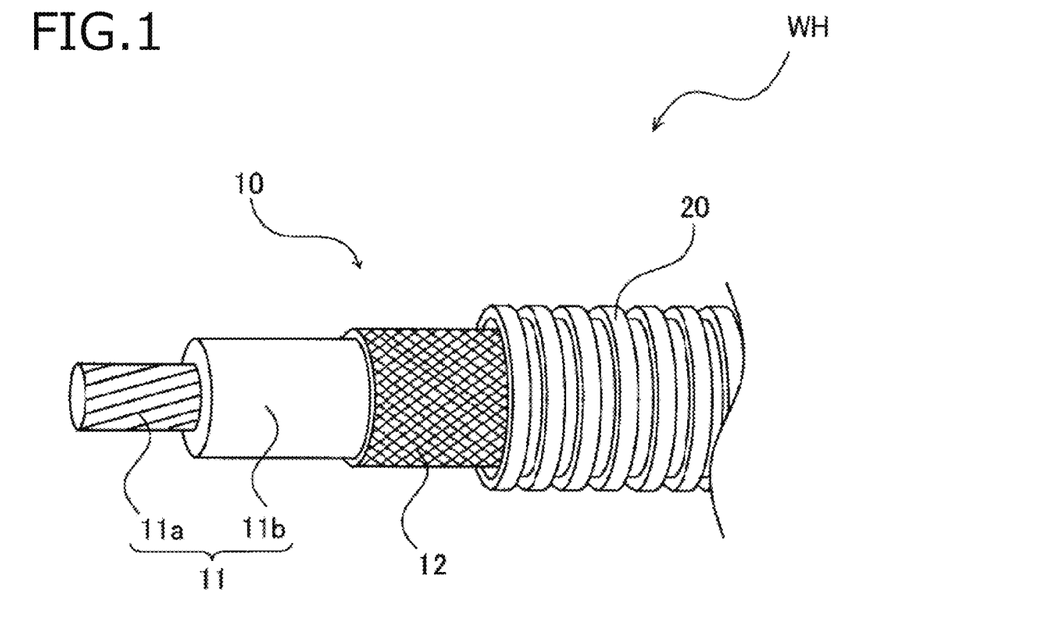
FIG. 1 is a wire harness with a braid according to an embodiment of the present invention.

FIG. 1 is a wire harness with a braid according to an embodiment of the present invention. As shown in FIG. 1, a wire harness WH includes a shielded cable 10 and an exterior member 20 which covers a periphery of the shielded cable 10.

The shielded cable 10 includes an electric wire 11 and a braid 12 which covers a periphery of the electric wire 11. The electric wire 11 includes a conductor portion 11a and a covering portion 11b formed of an insulator. The conductor portion 11a is configured by a stranded wire obtained by twisting a plurality of metal element wires formed of copper, aluminum, an alloy thereof, or the like.

Figure 2:
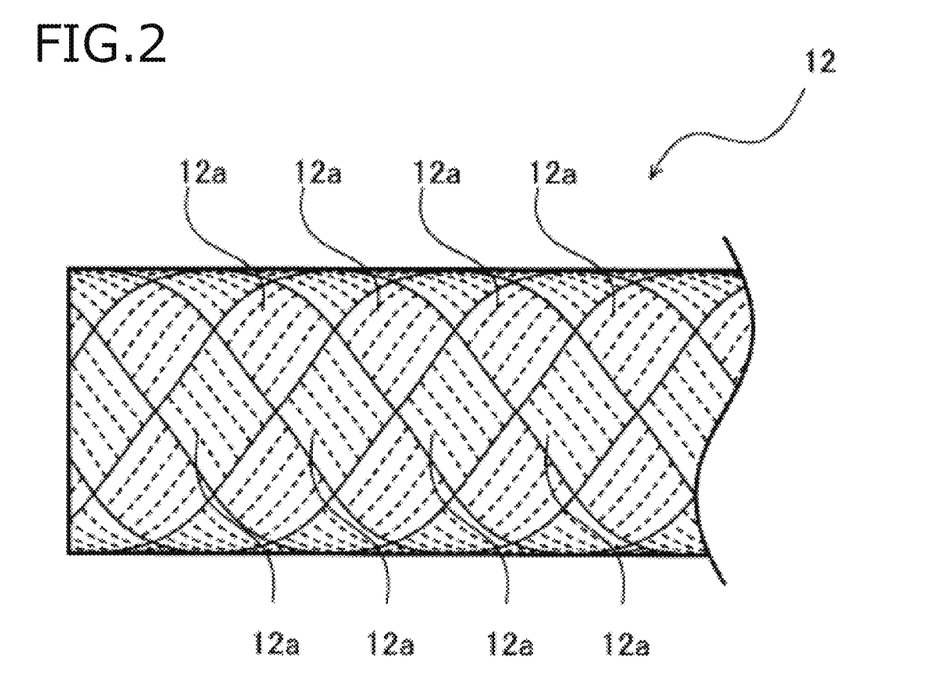
FIG. 2 is an enlarged view of the braid shown in FIG. 1.
Figure 3:
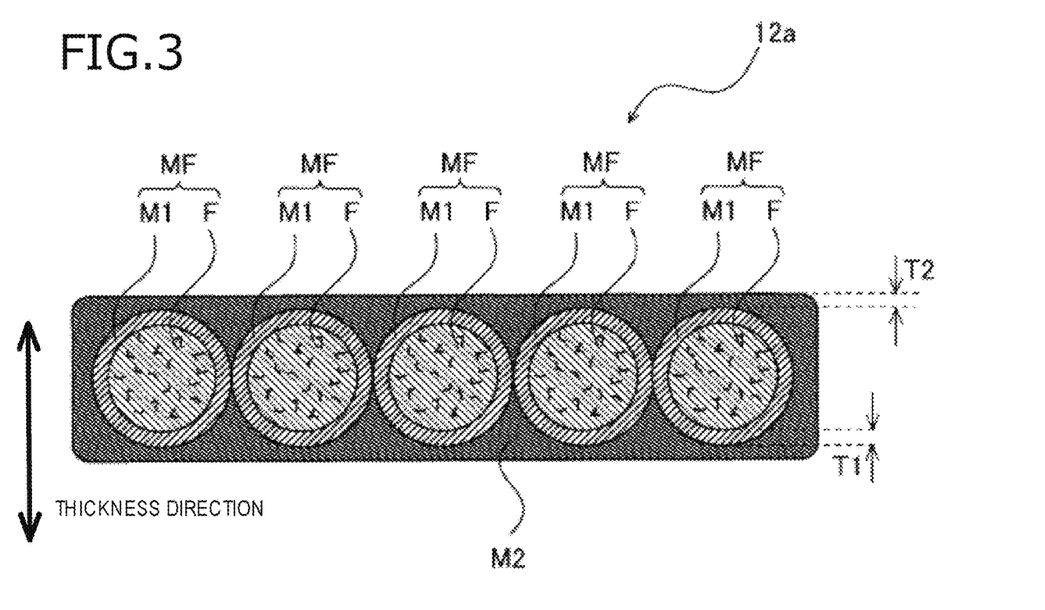
FIG. 3 is a partially enlarged cross-sectional view of the braid shown in FIG. 2.

FIG. 2 is an enlarged view of the braid 12 shown in FIG. 1, and FIG. 3 is a partially enlarged cross-sectional view of the braid 12 shown in FIG. 2. The braid 12 shown in FIGS. 1 and 2 blocks noise from the electric wire 11 and external noise. The braid 12 according to the embodiment is configured by braiding a plurality of metal-plated bundles 12a which are flattened.

Each metal-plated bundle 12a includes a plurality of tensile strength fibers F, first metal plating portions M1, and a second metal plating portion M2.

The plurality of tensile strength fibers F are fiber material chemically synthesized from raw materials such as petroleum, and tensile strength at break is 1 GPa or more and elongation at break is 1% or more and 10% or less. Examples of the fibers include aramid fibers, polyarylate fibers, and PBO (Poly-p-phenylenebenzobisoxazole) fibers.

The first metal plating portions M1 are metal-plated layers applied on tensile strength fiber F respectively. In the embodiment, each of the first metal plating portions M1 is formed of copper, for example. A metal-plated fiber MF is configured by applying the first metal plating portions M1 to the tensile strength fibers.

The second metal plating portion M2 is a metal-plated layer applied collectively to a plurality of metal-plated fibers MF. In the embodiment, the second metal plating portion M2 is formed of tin, for example.

In the example shown in FIG. 3, the plurality of metal-plated fibers MF are arranged adjacently so as to set the metal-plated bundle 12a into a single row in a thickness direction, but the present invention is not limited thereto, and the plurality of metal-plated fibers MF may be arranged in a plurality of rows in the thickness direction. Further, the present invention is not limited to a case where the metal-plated fibers MF are arranged in parallel with each other, and the metal-plated fibers MF may be distorted within a width range of the metal-plated bundle 12a but not being arranged in parallel with each other.

Here, for example, the second metal plating M2 has a surface roughness of 0.1 μm or more and 0.5 μm or less. When the surface roughness is less than 0.1 μm, film strength of the plating is decreased, so that a surface of the metal-plated bundle 12a is worn when repeated friction against other metal-plated bundle 12a or the exterior member occurs. Also, when the surface roughness is more than 0.5 μm, the metal-plated bundles 12a cannot move so as to slide with respect to each other, so that the metal-plated bundle 12a is likely to be caught during the repeated bending, and plastic deformation and folding of the metal-plated bundle 12a easily occur.

Incidentally, the above surface roughness indicates a result measured by the arithmetic average roughness (Ra) test method prescribed in JISB0601.

Further, a value obtained by dividing a thickness T2 of the second metal plating portion M2 by a thickness T1 of each of the first metal plating portions M1 is preferably 0.1 or more and 1.0 or less, and in particular, strain is preferably 4% or less. That is because when the value is less than 0.1, the fibers applied with the first metal plating portions M1 are scattered, the metal-plated bundle 12a cannot be flattened, and the wear resistance is decreased. Also, when the value is more than 1.0 (particular, the strain is 4% or more), the first metal plating layer portions M1 or the second metal plating layer portion M2 may be broken and the shielding effect is deteriorated.

Incidentally, the strain of 4% or less refers to strain applied to the first and second metal plating portions of the braid 12 with a perfect circular cross section braided by the metal-plated bundles 12a. Therefore, the strain here is a concept of excluding strain in a bending portion or a connecting portion to a shield connector.

The thickness T1 of each of the first metal plating portions M1 is plating thickness of the plating applied on each of the tensile strength fibers F. Meanwhile, the thickness T2 of the second metal plating M2 refers to that of a thinnest portion of the second metal plating portion M2, and in the example shown in FIG. 3, the thickness T2 refers to a height in the thickness direction of the metal-plated bundle 12a from an outermost end of the first metal plating portion M1.

Referring again to FIG. 1, the exterior member 20 is a protective member which covers the periphery of the braid 12 with a predetermined air gap therebetween, and for example, the exterior member 20 is a corrugated tube in which unevenness are continuous in a longitudinal direction thereof. For example, a slit extending in a longitudinal direction of the exterior member 20 is formed in the exterior member 20 which is a corrugated tube, so that the shielded cable 10 can be after-fitted into the exterior member 20 from the slit. Incidentally, the exterior member 20 is not limited to a corrugated tube as long as it covers the shielded cable 10 with an air gap therebetween, and the exterior member 20 may be configured by a sheath for after-fitting or a sheath formed by tube molding. Further, the corrugated tube may not have the slit in the longitudinal direction thereof and the shielded cable 10 may pass through from an end opening of the corrugated tube.

Here, bendability of the braid 12 and the wire harness WH having the same can be improved. Hereinafter, the bendability of the braid 12 and the wire harness WH according to the embodiment will be described, but prior to this, the bendability of a braid 100 (see FIG. 7) and a wire harness according to a comparative example will be described.

Figure 4:
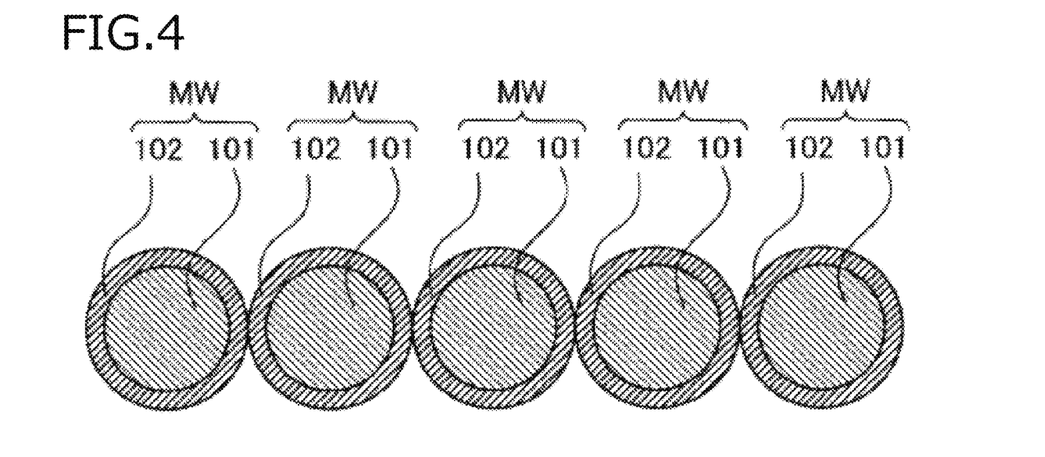
FIG. 4 is a partial cross-sectional view of a braid according to a comparative example.

FIG. 4 is a partial cross-sectional view of the braid 100 according to the comparative example. As shown in FIG. 4, the braid 100 according to the comparative example is formed by braiding a plurality of metal wires MW. Each metal wire MW is formed by plating a second metal portion 102 formed of tin on a first metal portion 101 formed of copper, for example. The braid 100 shown in FIG. 7 is configured such that sets of five metal wires MW are braided so as to be folded and overlapped with each other. In the set of five metal wires MW, the metal wires MW are not fixed with each other and the metal wires MW are fragmented. Therefore, as described with reference to FIG. 8, the metal wire MW is easily plastically deformed.

The braid 100 according to the comparative example is attached to a periphery of the electric wire 11 shown in FIG. 1 so as to obtain a sample, and a bending test is conducted thereon. In the bending test, in a state where no weight is attached to one end of the sample, the other end of the sample is bent in a range from 0° to 180° and the bending is repeated 50,000 times at a speed of 30 rpm using a 25 mm mandrel.

Figure 5:
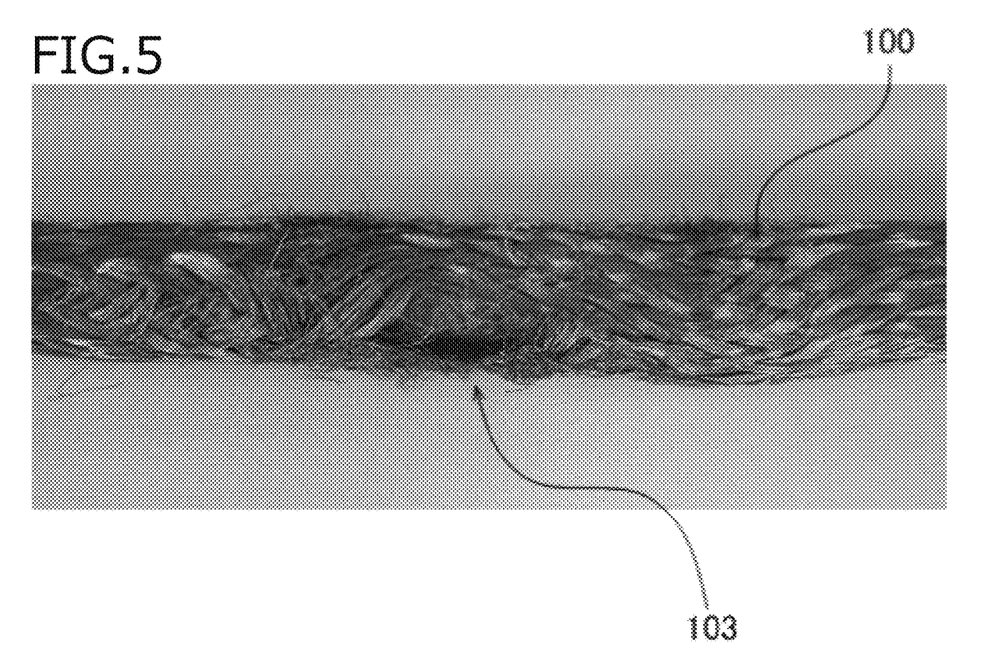
FIG. 5 is a view showing a state of the braid according to the comparative example after a bending test is conducted.

FIG. 5 is a view showing a state of the braid 100 according to the comparative example after a bending test is conducted. As shown in FIG. 5, plastic deformation as shown in FIGS. 8A and 8B is repeatedly applied to a metal wire MW in the braid 100 according to the comparative example, and the metal wire MW is disconnected. Further, since the disconnection concentrates at a bending part, an opening 103 as shown in FIG. 5 is also formed.

In particular, in a case where the exterior member 20 is provided on the braid 100 according to the comparative example, the braid 100 is repeatedly brought into contact with an inner wall of the exterior member 20 when being bent. For this reason, the metal wire MW of the braid 100 is repeatedly brought into contact with the inner wall of the exterior member 20 and is worn, which also causes disconnection of the metal wire MW.

From the above, there is a concern that the shielding performance of the braid 100 according to the comparative example is decreased.

In contrast, the braid 12 according to the embodiment and the wire harness WH having the same are as follows.

Figure 6:
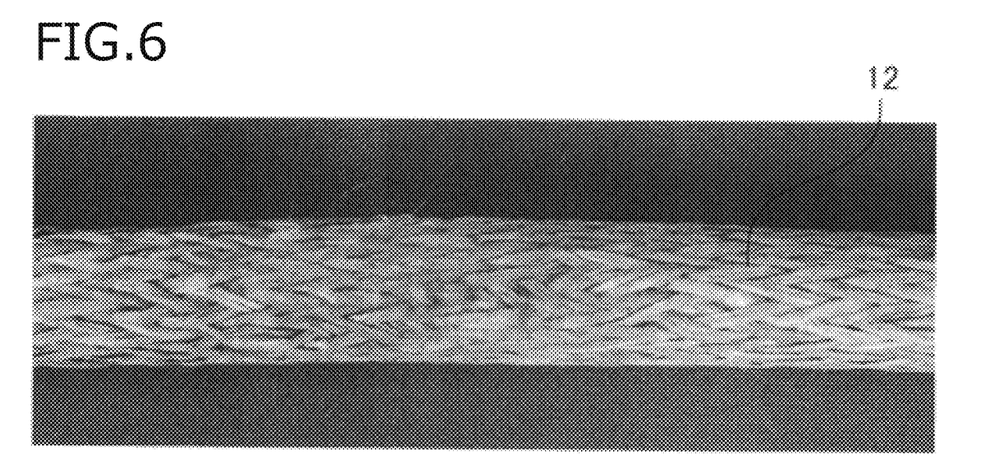
FIG. 6 is a view showing a state of the braid according to the embodiment after a bending test is conducted.

FIG. 6 is a view showing a state of the braid 12 according to the embodiment after a bending test is conducted. As shown in FIG. 6, the opening 103 as shown in FIG. 5 is not formed in the braid 12 according to the embodiment. When the braid 12 is bent and the metal-plated bundle 12a slides with respect to the other metal-plated bundles 12a, even if the metal-plated bundle 12a is caught somewhat by the other metal-plated bundles 12a, since the metal-plated bundle 12a is configured by grouping a plurality of metal-plated fibers MF by the second metal plating portion M2, the folding as shown in FIG. 8B is less likely to occur in the metal-plated bundle 12a with higher rigidity compared with one metal wire MW.

In addition, since the metal-plated fibers MF are obtained by applying the first metal plating portions M1 to the tensile strength fibers F respectively, even if the first metal plating portions M1 and the second metal plating portion M2 are plastically deformed due to occurrence of the folding, the internal tensile strength fibers F will not be plastically deformed due to properties thereof and is less likely disconnected.

Therefore, the metal-plated fibers MF in the metal-plated bundle 12a are less likely disconnected, and the opening 103 as shown in FIG. 5 is less likely formed.

Further, in the wire harness WH, the exterior member 20 is provided on the braid 12, and the braid 12 is repeatedly brought into contact with an inner wall of the exterior member 20 when being bent. However, since the braid 12 according to the embodiment is formed by braiding the flattened metal-plated bundles 12a, the metal-plated bundles 12a can be brought into surface contact with the inner wall of the exterior member 20, and a possibility of disconnection caused by the wear is lowered compared with a case where one metal wire MW is brought into contact (line contact) with the inner wall of the exterior member 20.

Thus, according to the braid 12 of the embodiment, metal-plated bundles 12a flattened by applying the second metal plating portion M2 collectively to a plurality of metal-plated fibers MF are braided, so that when the braid 12 is bent and the metal-plated bundle 12a slides with respect to the other metal-plated bundles 12a, even if the metal-plated bundle 12a is caught somewhat by the other metal-plated bundles 12a, since the metal-plated bundle 12a is configured by grouping a plurality of metal-plated fibers MF by the second metal plating portion M2, the folding is less likely to occur in the metal-plated bundle 12a with higher rigidity compared with one metal wire MW. In addition, since the metal-plated fibers MF are obtained by applying the first metal plating portions M1 to the tensile strength fibers F respectively, even if the first metal plating portions M1 and the second metal plating portion M2 are plastically deformed due to occurrence of the folding, the internal tensile strength fiber F will not be plastically deformed due to properties thereof. Due to the above circumstances, the disconnection becomes less likely to occur in the metal-plated bundle 12a, so that a braid 12 capable of improving bending resistance can be provided.

Further, since the second metal plating portion M2 has a surface roughness of 0.1 μm or more and 0.5 μm or less, the metal-plated bundle 12a easily slides due to the surface roughness, and when the braid 12 is bent and the metal-plated bundle 12a slides with respect to the other metal-plated bundles 12a, it is possible to prevent the metal-plated bundles 12a from rubbing against each other so as to prevent the disconnection.

Further, since a value obtained by dividing the thickness T2 of the second metal plating portion M2 by the thickness T1 of each of the first metal plating portions M1 is 0.1 or more and 1.0 or less, and in particular when the strain is 4% or less, a situation in which the metal-plated fibers MF applied with the first metal plating portions M1 are easily scattered and the metal-plated bundle 12a is difficult to be flattened can be prevented, and meanwhile the possibility of breaking the first metal plating portions M1 and the second metal plating portion M2 by the bending can be lowered.

Further, according to the wire harness WH of the embodiment, since the exterior member 20 which covers the periphery of the braid 12 with a predetermined air gap therebetween is provided, there is a concern that when the wire harness WH is bent, the braid 12 is brought into contact with the inner wall of the exterior member 20 and is worn, due to which the one-wire layer may be easily disconnected, but since the metal-plated bundles 12a are flattened, the metal-plated bundle 12a can be brought into surface contact with the inner wall of the exterior member 20, and a possibility of disconnection caused by the wear is lowered compared with a case where one metal wire MW is brought into contact with the inner wall of the exterior member 20.

The present invention has been described based on the embodiments, but the present invention is not limited to the embodiments described above and can be appropriately modified without departing from the spirit of the present invention, and may be appropriately combined with well-known and known techniques.

For example, in the above embodiment, the braid 12 is directly provided on the electric wire 11, but the present invention is not limited thereto, and inclusions such as metal foils may exist between the electric wire 11 and the braid 12. Further, the braid 12 is provided in the periphery of one electric wire 11, but the present invention is not limited thereto, and the braid 12 may be provided on a plurality of electric wires.

In addition, the metal-plated bundle 12a of the braid 12 according to the embodiment includes the first metal plating portions M1 and the second metal plating portion M2, but in addition to this, a third metal plating portion may be provided between the first metal plating portions M1 and the second metal plating portion M2, so that the metal plating may have a structure of three layers. Further, the metal-plated bundle 12a may have a structure of four or more layers of metal plating.

What is claimed is:

1. A braid comprising:
    a plurality of metal-plated bundles braided to each other, each of the metal-plated bundles having a flattened shape,
    wherein each of the metal-plated bundles comprises:
    a plurality of tensile strength fibers;
    a plurality of first metal plating portions that are formed on the tensile strength fibers respectively; and
    a second metal plating portion including the first metal plating portions therein, the first metal plating portions having the tensile strength fibers respectively,
    wherein the second metal plating portion has a surface roughness of 0.1 µm or more and 0.5 µm or less.

2. A braid comprising:
    a plurality of metal-plated bundles braided to each other, each of the metal-plated bundles having a flattened shape,
    wherein each of the metal-plated bundles comprises:
    a plurality of tensile strength fibers;
    a plurality of first metal plating portions that are formed on the tensile strength fibers respectively; and
    a second metal plating portion including the first metal plating portions therein, the first metal plating portions having the tensile strength fibers respectively,
    wherein a value obtained by dividing a thickness of the second metal plating portion by a thickness of each of the first metal plating portions is 0.1 or more and 1.0 or less.

* * * * *